United States Patent
Bohnert et al.

[19]

[11] Patent Number: 6,140,810
[45] Date of Patent: Oct. 31, 2000

[54] FIBER-OPTIC VOLTAGE SENSOR FOR OUTDOOR HIGH-VOLTAGE INSTALLATIONS

[75] Inventors: Klaus Bohnert, Niederrohrdorf; Hubert Brändle, Oberengstringen; Philippe Gabus, Gebenstrof; Jadran Kostovic, Neuenhof; Jiri Talir, Buchs, all of Switzerland

[73] Assignee: ABB Research Ltd., Zurich, Switzerland

[21] Appl. No.: 09/165,648

[22] Filed: Oct. 2, 1998

[30] Foreign Application Priority Data

Oct. 2, 1997 [DE] Germany ............... 197 43 658

[51] Int. Cl.⁷ .............. G01R 15/24; G01R 29/12
[52] U.S. Cl. ................. 324/96; 324/72
[58] Field of Search ................ 324/96, 244.1, 324/72, 72.5, 109, 126; 250/215, 227.14

[56] References Cited

U.S. PATENT DOCUMENTS

| | | |
|---|---|---|
| 4,319,186 | 3/1982 | Kingsley . |
| 4,477,723 | 10/1984 | Carome et al. . |
| 4,524,322 | 6/1985 | Bobb . |
| 4,929,830 | 5/1990 | Bohnert et al. . |
| 5,053,693 | 10/1991 | Bohnert et al. . |
| 5,053,694 | 10/1991 | Bohnert et al. . |
| 5,339,026 | 8/1994 | Bohnert . |
| 5,343,036 | 8/1994 | Bohnert . |

FOREIGN PATENT DOCUMENTS

| | | |
|---|---|---|
| 0 316 619 | 5/1989 | European Pat. Off. . |
| 0 316 635 | 5/1989 | European Pat. Off. . |
| 0 433 824 | 6/1991 | European Pat. Off. . |
| 0 569 700 | 11/1993 | European Pat. Off. . |
| 28 56 183 | 7/1980 | Germany . |
| 40 25911 | 4/1991 | Germany . |
| 41 14 253 | 11/1992 | Germany . |
| 41 15370 | 11/1992 | Germany . |
| 41 28 687 | 3/1993 | Germany . |
| 42 29 449 | 3/1994 | Germany . |
| 196 05 717 | 5/1997 | Germany . |

*Primary Examiner*—Walter E. Snow
*Attorney, Agent, or Firm*—Burns, Doane, Swecker & Mathis, L.L.P.

[57] ABSTRACT

The subject matter of the present invention is a fiber-optic outdoor high-voltage sensor 1. The known sensor principle is based on the fact that a piezoelectric quartz cylinder 3 wound with a glass fiber 4a effects a voltage-proportional fiber strain which is measured interferometrically. According to the invention, a 420 kV outdoor sensor 1 is created by virtue of the fact that several quartz cylinders 3 and electrically conductive spacing elements 5 are arranged in an alternating fashion one behind another and are sealed in a silicone-shielded 17 insulating tube 16 by means of polyurethane 18 or silicone 21. Dividing the high voltage between several spaced, E-field integrating sensor elements 2 permits simple field control and a very high measuring accuracy. In addition, the fiber-optic voltage sensor 1 is distinguished by a low outlay on insulation, compactness and low weight, and can easily be scaled to other voltage levels and be effectively combined with optical current sensors 38.

14 Claims, 6 Drawing Sheets

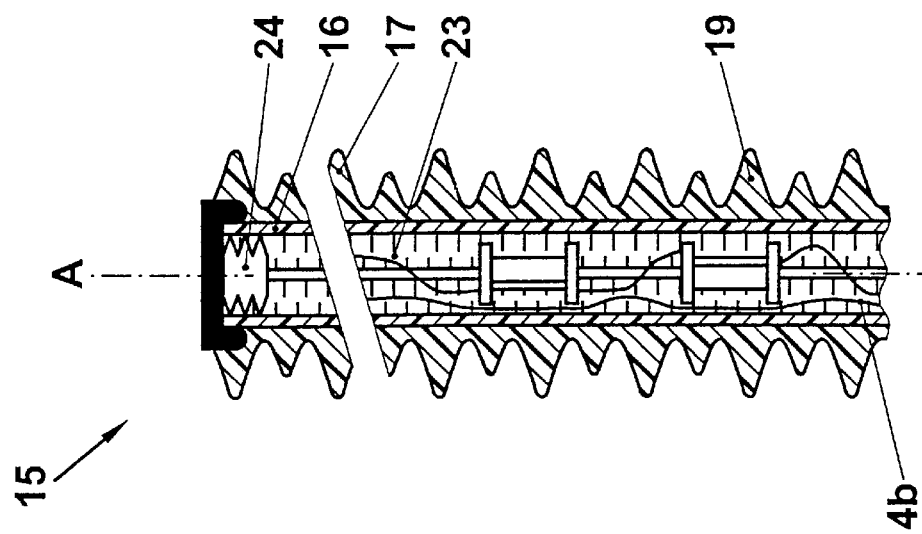
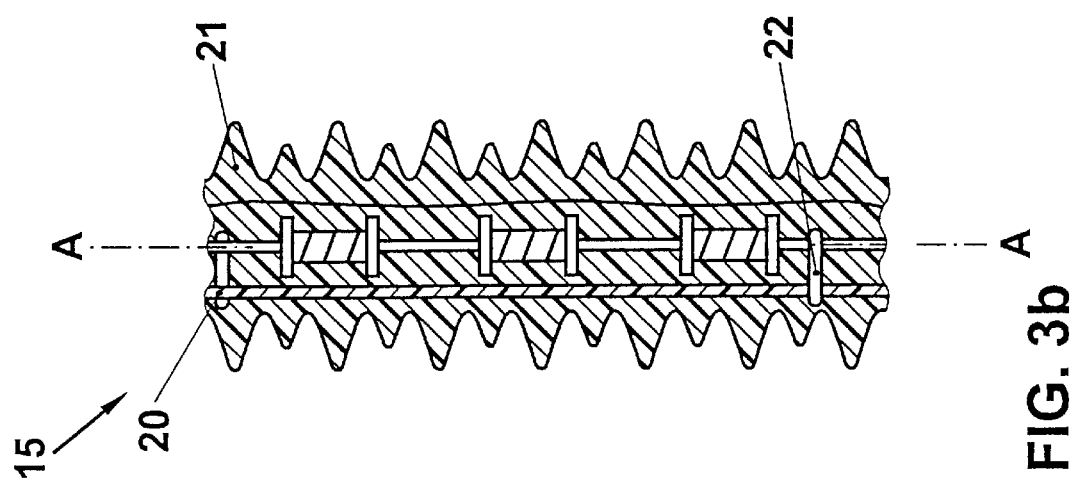
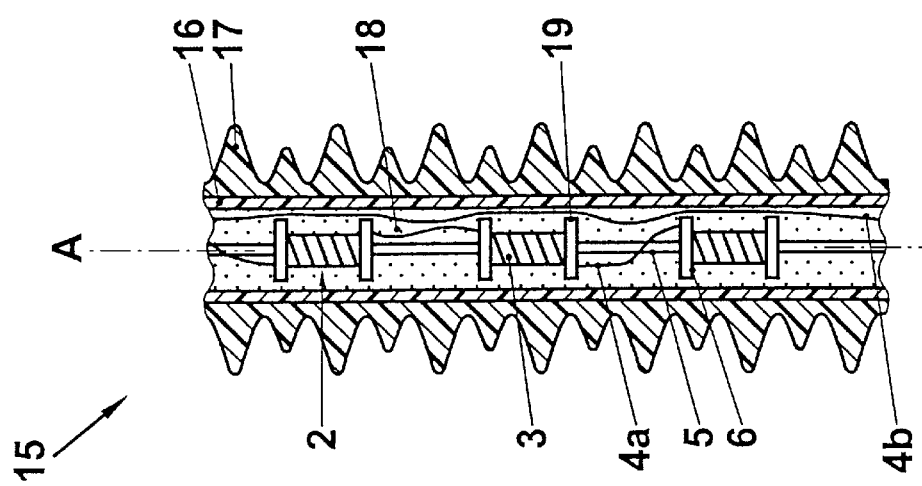

FIBER-OPTIC VOLTAGE SENSOR FOR OUTDOOR HIGH-VOLTAGE INSTALLATIONS

BACKGROUND OF THE INVENTION

1. Field of the Invention

The invention relates to the field of optical measurement of electric voltages.

2. Discussion of Background

A fiber-optic voltage sensor of the type mentioned at the beginning is known, for example from EP 0 316 635 B1. The sensor principle is based on the fact that a strain, induced by an electric field, in a piezoelectric sensor body is transmitted to a fiber, and the change in length of the latter is detected interferometrically. Quartz is frequently used as the piezoelectric material. Various types of glass fiber interferometers can be used for the interferometric measurement, such as a Mach-Zehnder, a Fabry-Perot or a double-mode fiber interferometer, for example. It is known from EP 0 529 339 A1 to connect in series in the manner of a tandem interferometer two double-mode fiber interferometers separated by a monomode fiber which is not susceptible to interference. The tandem interferometer is operated in transmission or, in accordance with EP 0 569 700 A2, in reflection. A variant with a polarimetric sensor fiber instead of a double-mode sensor fiber is disclosed in DE 196 05 717 C1. It is also known from DE 41 15 370 A1 to detect the change in length of a double-mode fiber with the aid of the Guoy effect.

Various methods are employed to compensate the temperature dependence of the fiber-optic voltage sensor. It is proposed in EP 0 433 824 B1 for the piezoelectric sensor and demodulation elements to be of identical design and to be operated at the same temperature. For this purpose, DE 42 29 449 specifies special quartz sections and fiber fastenings, for which the temperature response of the piezoelectric effect can be eliminated. The German Patent Application with the file number 197 01 221.3, which was not published before the priority date, shows that it is possible in a double-mode fiber interferometer to determine the sensor temperature from the interference contrast and to compensate its influence on the sensor signal.

In accordance with EP 0 316 619 B1, it is possible to implement selective measurement of a single E-field component by means of special crystal classes, orientations and shapes of the piezoelectric body, as well as by the type of the fiber fastening. In EP 0 316 635 B1 cited firstly above, it is disclosed, furthermore, that a voltage sensor which integrates the local E-field can be approximated by lining up such direction-sensitive sensor elements with dielectric spacers.

A range of variants for integrating a fiber-optic voltage transformer in a gas-insulated switchgear (GIS) are published in the prior art. DE 40 25 911 A1 shows for a one-phase GIS that the high voltage can be determined reliably by local field measurements using several sensor elements which are arranged on the inside of the GIS enclosure distributed over the circumference. By contrast, in the German Patent Specification with the file number 196 04 908.3, which was not published before the priority date, a voltage measurement is implemented in a three-phase GIS by bridging the entire high voltage in each phase by means of a quartz cylinder together with its fiber winding. The three voltage sensors are completely immersed in the $SF_6$ overpressure atmosphere of the GIS in order to insulate the very high E-field strengths. In addition, an insulating tube is provided for protecting the quartz cylinders and sensor fibers against chemically aggressive gases. Moreover, DE 195 48 467 A1 shows a suspension, which is not susceptible mechanically to interference, of the fiber-optic voltage sensor, in which axial forces act antisymmetrically at both ends on the end faces of the quartz cylinder, with the result that the fiber strain averaged over the cylinder length vanishes. All the documents named above are hereby intended to apply in their full scope as a constituent part of the disclosure of the present invention.

To date, no fiber-optic voltage sensor has been specified which would be suitable for measuring high voltage outdoors. On the one hand, local field measurements are completely inadequate outdoors, since the E-field distributions vary strongly depending on the weather and the circuit state of neighboring outdoor switches. On the other hand, it is very expensive to bridge the entire potential difference using an approximating voltage sensor several meters long in accordance with EP 0 316 635 B1. An adequate integration accuracy would require very many sensor elements. Nevertheless, the total voltage would be divided between the sensor and intermediate elements, with the result that a variable dielectric response of the intermediate elements would falsify the voltage drop across the sensor elements, and thus the measuring accuracy.

A flexible suspension of thyristor power converters for oil or gas platforms or for protection against earthquakes is known from DE 3 010 294 C2. In this case, several power converters are fastened to a yoke next to one another via insulators and, if necessary, clamped to the ground via insulators in series to form damping elements. The design is clearly not intended for high voltages.

Finally, there is a widespread prior art relating to current sensors with an isolated sensor head. These include, in particular, magneto-optic current sensors having a glass block sensor head or a sensor fiber (see, for example, the German Patent Applications, which were not published before the priority date, with the file numbers 196 21 654.0 and 197 03 128.5), but also hybrid optical current sensors with an electronic sensor head at high voltage potential and optical power supply and signal transmission.

SUMMARY OF THE INVENTION

Accordingly, one object of the invention is to provide a novel fiber-optic voltage sensor which is suitable for measuring high voltages outdoors and is distinguished by a simple, slim and robust design and a very high measuring accuracy.

To be specific, the core of the invention is to design a fiber-optic voltage sensor from one or more sensor elements, which integrate the E-field, and electrically conductive spacing elements, and to form a high-voltage part of the voltage sensor which can be used outdoors by virtue of the fact that the arrangement of the sensor and spacing elements is surrounded by a high-voltage-proof dielectric and is provided with a protective shield.

An exemplary embodiment shows the internal structure of a 420 kV high-voltage sensor with several piezoelectric sensor elements which are connected to one another and to the connector contacts via electrically conductive spacing elements and flexible holders.

A further exemplary embodiment relates to the dielectric sensor package which has, as dielectric, preferably a polyurethane or silicone elastomer sealing compound and, as protective shield, a silicone shield with post insulator.

Another exemplary embodiment shows the fiber-optic voltage sensor with an integrated current sensor and a high-voltage part which is mounted suspended on the conductor in the vicinity of a high-voltage outdoor switch.

An important advantage of the voltage sensor according to the invention consists in that the entire high voltage drops only across the integrating sensor elements, thus achieving excellent accuracy of integration and measurement.

A further advantage of the voltage sensor consists in that owing to its elongated structure, in particular in the form of a capacitive voltage divider, it is possible to control the field distribution via the sensor elements, in the dielectric package and in the surrounding outdoor environment.

Also very advantageous is the simple possibility of scaling the voltage sensor to other voltage levels, since the overall length and the diameter as well as the number, length and position of the sensor elements can easily be adapted.

Other advantages of the voltage sensor relate to the compactness, the low weight, the freedom from maintenance, the ease with which it can be combined with optical current sensors and the low production costs.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 shows high-voltage-proof, dielectric packages for a fiber-optic voltage sensor in accordance with FIG. 1;

DESCRIPTION OF THE PREFERRED EMBODIMENTS

Figure 1:
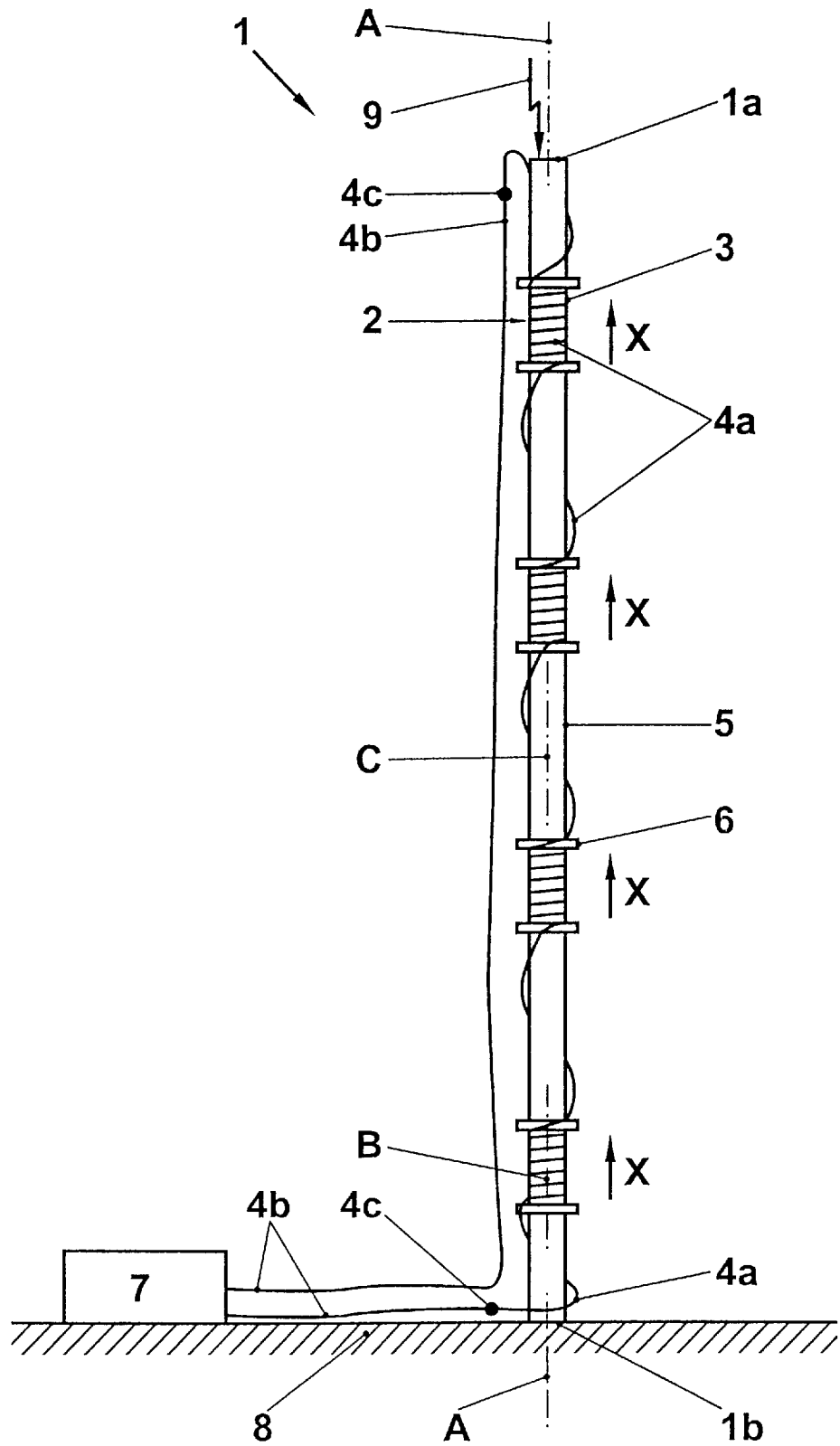
FIG. 1 shows one internal structure of a fiber-optic high-voltage sensor according to the invention with four fiber-wound quartz cylinders as sensor elements and five metal cylinders as spacing elements.

The subject matter of the invention is a fiber-optic high-voltage sensor for outdoor applications. In outdoor high-voltage installations, voltages of up to several 100 kV must be measured with high accuracy. The dielectric strength of a sensor must, moreover, also be ensured in the case of lightning impulse and switching impulse voltages which can be much higher. The structure and the dielectric package of the high-voltage sensor are represented by way of example with the aid of a sensor design for 420 kV outdoor switchgear. As regards the basic measurement principle, reference is made to the printed publications also included in the disclosure, in particular EP 0 316 619 B1, EP 0 316 635 B1, EP 0 529 339 A1 and EP 0 569 700 A2. In a preferred configuration, an alternating voltage is applied to the end faces 2a, 2b of a quartz cylinder 3, which is wound at a constant lead with a double-mode sensor fiber 4a and whose axis is parallel to the crystallographic x-axis, a periodic change in circumference is induced piezoelectrically, the resulting fiber strain is converted into a modulation of the phase difference between the two spatial optical modes ($LP_{01}$ and even $LP_{11}$ mode), the wave fronts of the two modes are transmitted without interference via a monomode connecting fiber 4b to a double-mode receiving fiber, and the interference pattern at the end thereof is detected. The phase or intensity modulation is then proportional to the measuring voltage. The intensity modulation can be compensated with the aid of an electronic control circuit and one or more piezoelectric modulators on the receiving fiber, with the result that the control voltage supplies an exact negative image of the measuring voltage. It is advantageous to combine the transmitting and receiving optics together with the measuring electronics in one optoelectronic measurement apparatus 7.

Referring now to the drawings, wherein like reference numerals designate identical or corresponding parts throughout the several views, FIG. 1 shows a design according to the invention of a fiber-optic high-voltage sensor 1 with four identical sensor elements 2 which are connected to one another and to the connector contacts 1a, 1b in an electrically conductive fashion via spacing elements 5, in particular metal cylinders 5 and holders 6. The sensor elements 2 comprise quartz cylinders 3 whose crystallographic x-axes are identically orientated and which are uniformly and completely wound with a continuous sensor fiber 4a. Identical orientation means that for a right-handed coordinate system the positive x-directions point to the same (opposite) connector contact 1a, 1b in the case of identical (opposite) handedness of the quartzes. The sensor axis A extends from ground potential 8 as far as high-voltage potential 9 and defines between the connector contacts 1a, 1b an integration path which runs in the region of the quartz cylinders 3 through the longitudinal or body axes B. The sensor fiber 4a is connected to the measurement apparatus 7 via splices 4c and connecting fibers 4b.

The sensor arrangement 2, 5 according to the invention is distinguished in that, on the one hand, the high voltage is distributed over the entire sensor length of several meters, which is a precondition for the dielectric control of the electric field strengths outdoors, and, on the other hand, the entire high voltage drops exclusively over the individual quartzes 3, with the result that component voltages can be determined by exact E-field integration.

Figure 2:
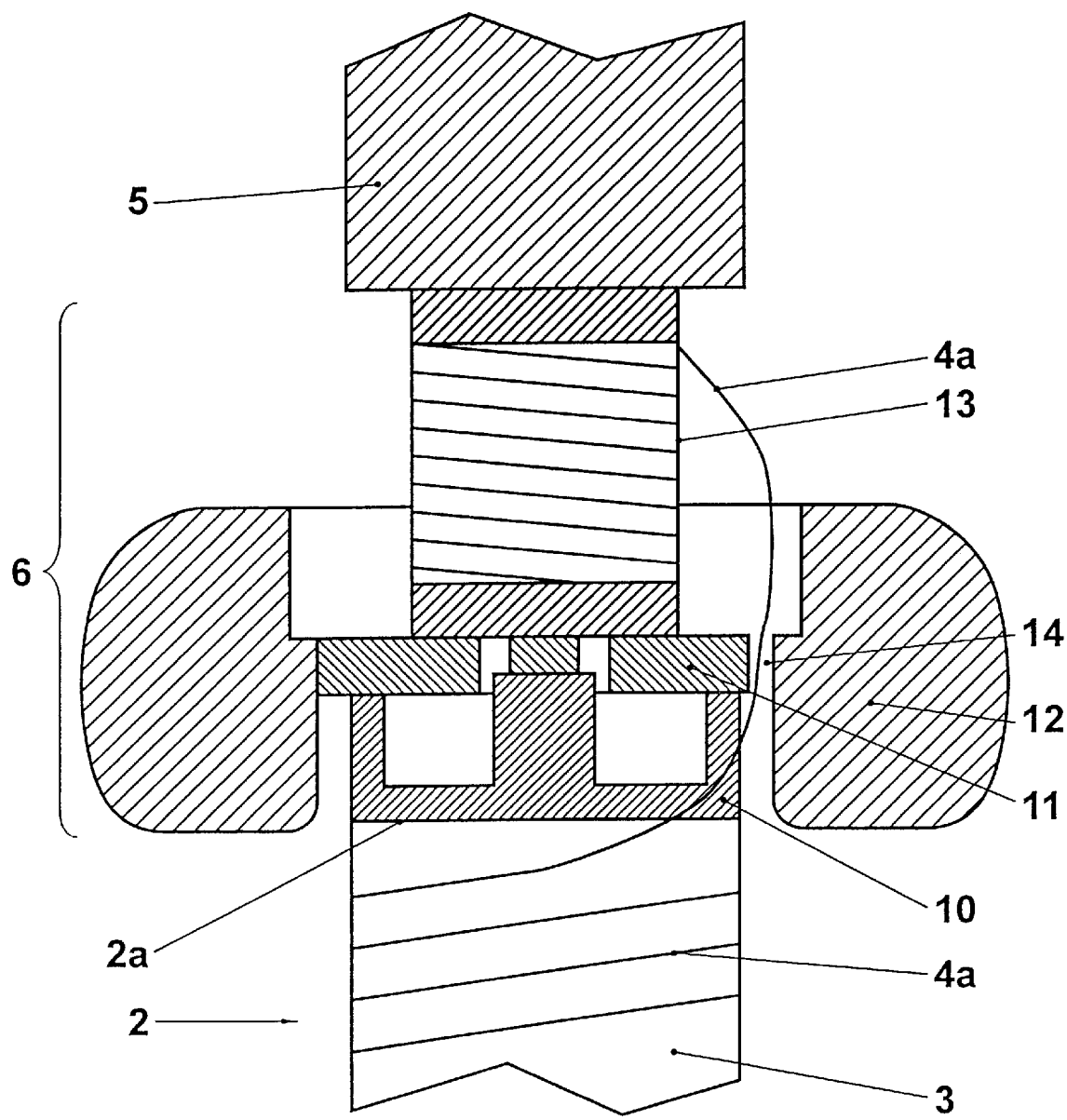
FIG. 2 shows a detailed view of a flexible holder between a sensor element and a spacing element.

An exemplary embodiment of an electrically conductive and mechanically flexible holder 6 is presented in FIG. 2. Using an electrically conductive adhesive, an inner electrode 10 of the same diameter and similar thermal expansion is bonded to the end face 2a, 2b of a quartz cylinder 3. The inner electrode 10 is screwed in an electrically conductive fashion via an intermediate plate 11 to a control electrode 12, made from aluminum and to a spring element 13. The intermediate plate 11 has a cutout 14 for threading through the sensor fiber 4a. The control electrode 12 serves to control the field distribution over the quartz cylinder 3. The spring element 13 creates an axially, and also laterally, flexible connection to the neighboring metal cylinder 5. As a result, the whole sensor arrangement is elastic in the longitudinal and transverse directions, different thermal expansions of the sensor arrangement 2, 5 and its dielectric package are compensated, and the quartz cylinders 3 are protected against mechanical loads. All the spring elements 13 are preferably selected to be identical, in order to implement a symmetrical suspension which particularly lacks susceptibility to interference.

Of course, other, in particular rigid, embodiments of the holders 6 are also possible. However, for dielectric reasons it is desirable for the holders 6 to be electrically conductive, and for the inner electrodes 10 to be connected to the end faces 2a, 2b of the quartz cylinders 3 in a self-closed and bonded fashion.

Three exemplary embodiments of the dielectric package of the voltage sensor 1 are shown in FIG. 3. In order to form a high-voltage part 15 of the voltage sensor 1 which can be used outdoors, it is necessary for the arrangement of the sensor and spacing elements 2, 5 to be surrounded by a high-voltage-proof dielectric 18, 21, 23 and to be provided with a protective shield 16, 17, 20, 21. In particular, the dielectric consists of an elastomer 18, 21, an insulating liquid 23 or, possibly, an insulating gas, and the protective shield 16, 17, 20, 21 consists of an elastomer 17, 21 with an additional post insulator 16, 20. It is also possible to use a porcelain insulator as an alternative to the protective shield 16, 17, 20, 21.

In detail, FIG. 3a shows a sensor arrangement 2, 5 which is mounted inside a high-voltage insulating tube 16. The insulating tube 16 preferably consists of a fiber-reinforced plastic and is cast with a ribbed silicone shield 17 which has a sufficiently long creepage path between ground potential 8 and high-voltage potential 9. The sensor arrangement 2, 5 is centered in the tube 16 with the aid of holding pins 19 for the control electrodes 12, and sealed with polyurethane 18.

In the case of the polyurethane seal, the problem consists in selecting a castable polyurethane mixture such that the cured polyurethane sealing compound 18 has a low hardness in the relevant temperature range, for example between −40° C. and 85° C., and yet has an adequate dielectric strength. A resin and a curing agent of the polyurethane mixture are preferably selected such that the Shore hardness A of the polyurethane sealing compound 18 has a value of less than 18 at room temperature. The polyurethane mixture is filled in liquid form into the tube 16 with the preassembled sensor arrangement 2, 5 and cures at room temperature within one to two days. The mechanical stress which the polyurethane sealing compound 18 exerts on the glass fibers 4a, 4b and, in particular, on the sensor fiber 4a is then small and does not have a disturbing effect in changing the optical properties of the fibers 4a, 4b. The polyurethane sealing compound 18 also has a relatively high compressibility, and can therefore compensate its own thermal expansion in the tube 16 without any problem. Overall the result is a package which is compatible with the fiber optics, can be loaded dielectrically and is mechanically stable.

FIG. 3b shows an embodiment in which the dielectric and the protective shield consist of a silicone sealing compound in the form of a ribbed silicone body 21, and the silicone body 20, 21 has at least one insulating bar 20 made from a fiber-reinforced plastic. The sensor arrangement 2, 5 is fastened to the insulating bar 20 with fixings 22.

The silicone sealing is performed in a shield-shaped mold which is removed again after the curing. The result is a self-supporting silicone body 21 which is mechanically strengthened by the at least one insulating bar 20 and whose shield has a creepage path of sufficient length. The Shore hardness of the cured silicone sealing compound 21 must, in turn, be selected to be sufficiently low. It is preferred to use a silicone variety which cross-links near room temperature. This avoids the mechanical stress which is produced during cooling by thermal contraction in silicones with a high vulcanization temperature of typically 130° C. to 150° C. This sensor package is more cost-effective than sealing the sensor arrangement 2, 5 in an insulating tube 16. However, the mechanical stability is lower. Consequently, this solution is suitable chiefly for lower voltage levels at which the high-voltage part 15 is correspondingly shorter.

Finally, FIG. 3c shows a variant of FIG. 3a, in which a transformer or silicone oil 23 is used instead of the polyurethane sealing compound 18. Also required here are a bellows or pressure compensation element 24 for compensating the thermal expansion of the oil 23, and also oil-tight fiber bushings 28. Also conceivable in principle is a gas-tight variant with $SF_6$ or $N_2$ under pressure, or compressed air as dielectric. A fluid medium 23 exerts no stress at all on the glass fibers 4a, 4b but must possibly be monitored because of the risk of leakage.

Figure 4:
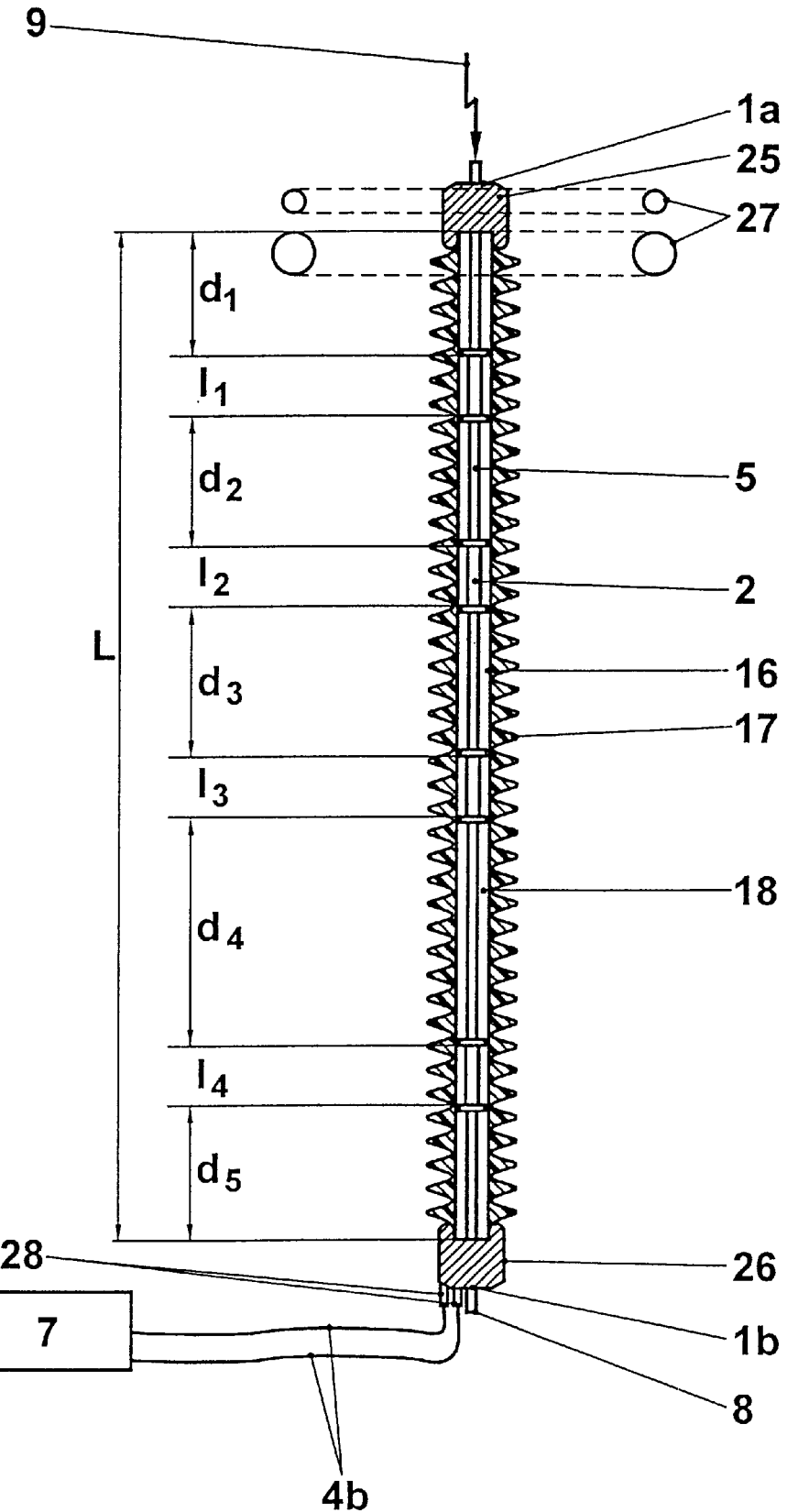
FIG. 4 shows the overall design of a fiber-optic voltage sensor in accordance with FIGS. 1–3 for the 420 kV class.

Represented in FIG. 4 is the overall design of the voltage sensor 1 in accordance with the variant of FIG. 3a for a voltage level of 420 kV phase-to-phase or, effectively, 242 kV phase-to-ground. The insulating tube 16 is provided at both ends with metal flanges 25, 26 which serve to fasten the sensor arrangement 2, 5 and as the mounting, and also as connector contacts 1a, 1b of the high-voltage part 15. The flange at the ground end is, moreover, fitted with fiber bushings or fiber plugs 28 for the feed and return fibers 4b of the sensor 1. For the sake of simplicity, the glass fibers 4a, 4b are not represented in the high-voltage part 15.

The insulating tube 16 has a total length L=3.20 m. The sensor 1 comprises four quartz cylinders 3 of diameter 30 mm and length $l_1 = l_2 = l_3 = l_4 = 150$ mm, as well as five spacing elements 5 of lengths $d_1 = 400$ mm, $d_2 = 425$ mm, $d_3 = 575$ mm, $d_4 = 750$ mm and $d_5 = 450$ mm. It is advantageous if, for a given overall length L, these lengths of the sensor and spacing elements 2, 5 are observed in a range of approximately ±5%. One or more corona and/or potential control rings 27 at the high-voltage end and/or ground end can be used for global control of the electric field distribution. Each quartz 3 then sees approximately one quarter of the total voltage.

Figure 5:
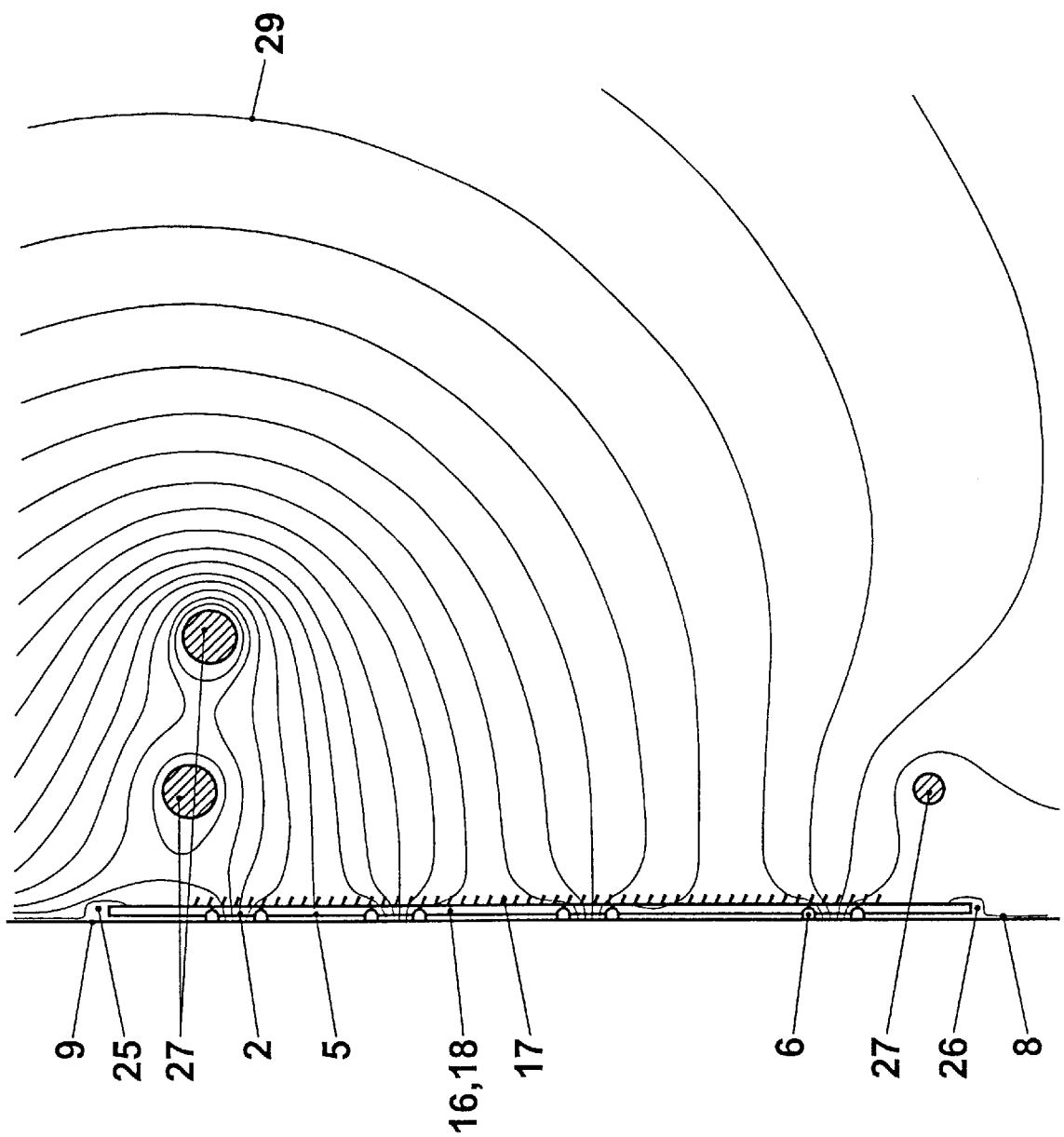
FIG. 5 shows the distribution of equipotential lines for a fiber-optic voltage sensor in accordance with FIG. 4.

The distribution of the equipotential lines 29 in the right-hand half plane may be seen in FIG. 5. The highest dielectric loads occur directly at the quartz crystals 3 and, here, particularly in the vicinity of the electrodes 10, 12. Starting from the sensor elements 2, the potential line density and the electric field strength decrease radially outward. The diameter of the high-voltage part 15, in particular the insulating tube 16 and the silicone shield 17 is now to be selected such that the field strength remains below the permissible limiting values in the air. For the example shown in FIG. 4, this is achieved by means of outside diameters of at least 90 mm for the insulating tube 16, and of at least 200 mm for the silicone shield 17. A 420 kV prototype of such design successfully withstood the high-voltage test, in particular 1425 kV lightning impulse, 1050 kV switching impulse and 1 minute 520 kV effective alternating voltage. The permissible limiting values of the E-field strengths in air amount in this case to 25 kV/cm for lightning impulse, and 3.5 kV/cm for effective alternating voltage.

Adapting the voltage sensor 1 in accordance with FIGS. 4, 5 to higher or lower voltage levels follows directly from what has been said by dimensioning the overall length and the diameter of the high-voltage part 15, the number, length, position and the diameter of the sensor elements 2 and, possibly, the corona and potential control rings 27 so as to produce an approximately uniform dielectric loading of the sensor elements 2 and to observe the limiting values for the field strengths in the high-voltage part 15 and outdoors. The length of the sensor elements 2 is favorably selected to be equal, and their spacings to increase relative to ground potential 8. The essential dimensioning criteria can be taken from the exemplary embodiment for the 420 kV class. For example, the sensor length is L≈1.3 m per 100 kV effective operating voltage phase-to-ground, and the total quartz length $l_1+, \ldots, +l_n$ (n=number of quartzes 3) amounts to approximately one fifth thereof. The invention also comprises those embodiments of the outdoor voltage sensor 1 which have only a single sensor element 2 with spacing elements at both ends, and are suitable for high voltages of the order of magnitude of 100 kV.

An important advantage of the outdoor voltage sensor 1 according to the invention by comparison with conventional voltage transformers consists in that the outlay on insulation can be drastically reduced because of the longitudinal extent and the small diameter of the sensor arrangement 2, 5. It is possible as a result to implement a cost-effective dielectric package, a slim configuration and a substantially reduced weight. The outdoor voltage sensor 1 can, moreover, thereby be handled more effectively and mounted in a versatile fashion.

Figure 6:
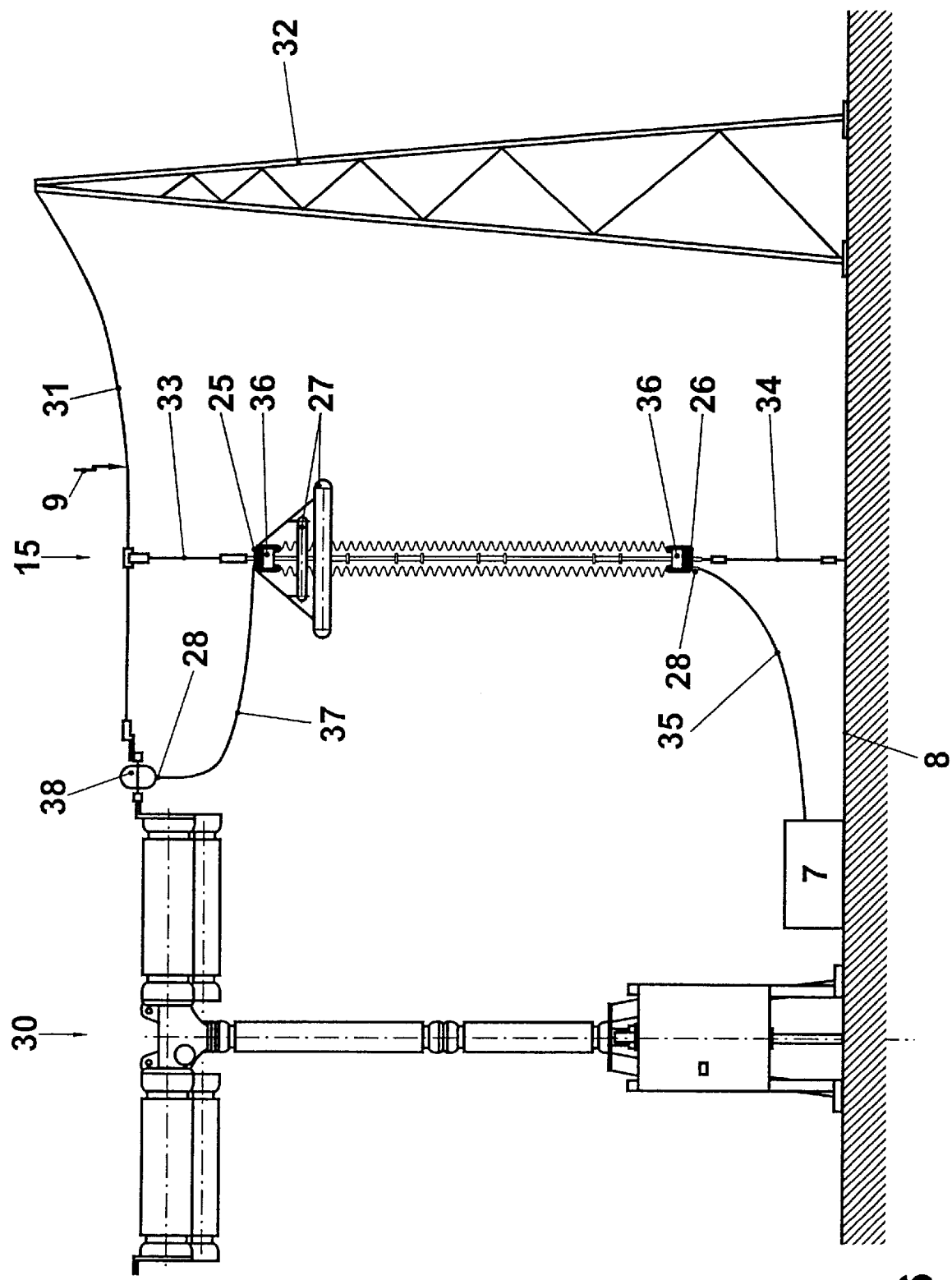
FIG. 6 shows a suspended mounting of a fiber-optic voltage sensor in accordance with FIG. 4 with an integrated optical current sensor.

FIG. 6 shows an installation of the 420 kV voltage sensor 1 and its combination with a (hybrid) optical current sensor 38. The sensor 1 is preferably mounted suspended on a conductor 31 in the vicinity of a high-voltage outdoor switch 30. The high-voltage part 15 comprises a suspension device 33, a grounding and anchoring cable 34 and, in particular, at least one corona and/or potential control ring 27. The suspension device 33, the rings 27 and the upper flange 25 of the insulating tube 16 are at high-voltage potential 9. The lower flange 26 is at ground potential 8, and is anchored to the ground by means of the cable 34.

A suspended mounting has the advantage that there is no need for any foundation, and that better requirements are made of the stability of the high-voltage part 15, in particular of the post insulator 16, 20. It is then possible for the long insulator 16, 20 to sag, for example when winds are high. However, this sagging is absorbed by the elastic holders 6, with the result that the sensor elements 2 remain mechanically unloaded. The silicone shield 17, 21 can be used in all weathers and also ensures adequate creepage paths even in the case of dampness and moisture.

The optical connecting fibers 4b of the voltage sensor 1 are led in a weather-proof plastic tube or fiber cable 35 from the flange 26 at the ground end to the measurement apparatus 7. The optical current sensor 38 is seated at the right-hand switch end and encloses the conductor 31. Its optical feed fibers are led in a further fiber cable 37 from the current sensor 38 to the flange 25 at the high-voltage end, and bridge the potential difference between the high voltage 9 and the ground 8 inside the high-voltage part 15. In the high-voltage part 15, the feed fibers for the current sensor 38 can also be sealed in the polyurethane 18 or silicone 17, 21, or be laid in the oil 23. At the ground end, they are preferably laid in the fiber cable 35 and connected to a detection unit integrated in the measurement apparatus 7. The ground flange 26 and the current sensor 38 preferably have fiber plugs 28, and the high-voltage flange 25 preferably has a fiber stowage space 36 for the fiber cable 37. Any isolated current sensor 38, that is to say one which is connected only via optical fibers, can be used as current sensor 38.

Advantages of the optical outdoor combined sensor 1, 38 include, inter alia, the modular design of current sensor 38, high-voltage part 15 and measurement apparatus 7, the ease of which connection can be made via freely suspended, detachable fiber cables 35, 37, and the possibility of installing the measurement apparatus 7 at a large distance outside the high-voltage environment.

The outdoor high-voltage sensor 1 according to the invention is not restricted either to the use of a double-mode fiber tandem interferometer nor to fiber-wound quartz cylinders 3 as sensor elements 2. Rather, any of the glass fiber interferometers mentioned at the beginning is suitable as optical detection method for the fiber strain. The fiber configuration is then to be adapted appropriately in the high-voltage part 15. The sensor fiber 4a can also be wound in a bifilar fashion, or the return connecting fibers 4b can be accommodated or sealed in the high-voltage part 15. In particular, one of the connecting fibers 4b is eliminated in reflection arrangements. One of the known methods for temperature compensation can likewise be applied. In principle, each sensor element 2 can be fitted with its own glass fiber interferometer. A total voltage signal can then be determined from the individual, calibrated interferometer signals.

The multifarious possibilities for embodying E-field integrating sensor elements 2 which have a vanishing transverse E-field sensitivity are set forth in EP 0 316 635 B1 and EP 0 316 619 B1. In practice, sensor elements 2 with a non-vanishing transverse E-field sensitivity are also permissible, since transverse E-fields can be kept very small by means of the field controllers 10, 12, 27 according to the invention. It is therefore essential to the invention that the at least one sensor element 2 comprises a piezoelectric body 3 and a sensor fiber 4a fastened thereto. Moreover, it is desirable for the sensor fiber 4a to be fastened with a prescribable length section to the body 3 such that it experiences changes in length only by virtue of E-field components parallel to the sensor axis A. If the voltage sensor 1 has at least two sensor elements 2 with a continuous sensor fiber 4a, to achieve a high accuracy of integration, each sensor element 2 is to have a gain which is proportional to its length and corresponds to the piezoelectrically induced change in length of the sensor fiber 4a.

Some important examples of E-field integrating sensor elements 2 with precisely vanishing transverse E-field sensitivity are mentioned again briefly below. Examples of disk-shaped piezoelectric bodies 3 wound with glass fiber are PVDF (polyvinylfluoride) which has been electrically polarized along the disk normal in the z-direction and stretched mechanically in the y direction, and also a piezoelectric ceramic, for example PZT, or $LiNbO_3$ (lithium niobate), whose z-axes are likewise orientated along the disk normal. The same materials can also be used for plate-shaped piezoelectric bodies 3, the need being for the fiber 4a to be fastened in a fashion elongated along the z-axis. In addition, a plate can be cut at right angles to the z-axis from PVDF or a piezoelectric ceramic, and the fiber 4a can be attached in an elongated fashion 4a in the plane of the plate.

For a given E-field strength or voltage, the gain of a sensor element 2 is proportional to a strain of the body 3 induced piezoelectrically and averaged over the fiber length, and to the fiber length itself. It is therefore a function of the material, crystallographic orientation and size of the piezoelectric body 3 as well as of the type of fiber fastening. Length-proportional gains are implemented most simply by means of identically designed sensor elements 2 which are not, however, necessarily of the same length.

For dielectric reasons, it is desirable, but not necessary, for the spacing elements 5 to be of cylindrical configuration and to be aligned with their axis C along the sensor axis A. Their diameter may be selected to deviate from that of the sensor elements 2, in particular to be smaller.

All the piezoelectric bodies 3 preferably consist of quartz, all the quartz bodies 3 being aligned with their crystallographic x-axis along the sensor axis A and being identically orientated. Each sensor element 2 can have several quartz bodies 3 and dielectrically insulating, non-piezoelectric spacers and end pieces. It is thereby possible for relatively long sensor elements 2 to be constructed from short quartzes 3. Each sensor element 2 preferably has precisely one quartz body 3, which can be assembled from several quartz pieces or be unipartite. The end pieces are also preferably eliminated, with the result that each quartz body 3 and, preferably, also the sensor fiber 4a fastened thereto bridge the entire length of the associated sensor element 2. Each quartz body 3 can have a cylindrical, in particular circular cylindrical, or plate-shaped configuration, one body axis B, that is to say a cylinder axis B or an axis B in the plane of the plate, being orientated parallel to the x-axis. The fiber 4a can be wound onto the cylinder or be fastened to the cylinder, in the interior of a hollow cylinder or to the plate in a fashion extending longitudinally in the x-direction. When the fiber is extended longitudinally in the x-direction, the quartz diameter can be chosen to be relatively small. In the case of the winding, the minimum quartz diameter is limited by the smallest permissible radius of curvature of the wound fiber 4a. The wound quartz cylinders 3 may have different diameters, if the lead of the winding is adapted in a fashion proportional to the diameter, that is to say if the lead angle of the winding is kept constant. The gains are then proportional once again to the length of the sensor elements 2. In particular, all the quartz cylinders 3 have precisely one prescribable diameter, and the sensor fiber 4a is wound on the circumference of each quartz cylinder 3 with a constant, prescribable lead.

Overall, the invention discloses a fiber-optic voltage sensor 1 which, because of its design as an elongated, E-field integrating, capacitive voltage divider and its dielectric package, which is compatible with the fiber optics, is outstandingly suitable for precise high-voltage measurements under outdoor conditions.

Obviously, numerous modifications and variations of the present invention are possible in light of the above teachings. It is therefore to be understood that within the scope of the appended claims, the invention may be practiced otherwise than as specifically described herein.

LIST OF DESIGNATIONS

1 Fiber-optic voltage sensor (internal structure)
1 a,1b Connector contacts
2,5 Sensor arrangement
2 Sensor elements
2 a,2b End faces of the sensor elements
3 Quartz cylinders, piezoelectric bodies
4 a,4b Glass fiber
4 a Double-mode fiber, sensor fiber
4 b Monomode fiber, connecting fiber
4 c Splice
5 Metal cylinder, spacing elements
6 Holders
7 Optoelectronic measurement apparatus
8 Ground potential
9 High-voltage potential
10 Inner electrode
11 Intermediate plate
12 Control electrode
13 Spring element
14 Cutout
15 High-voltage part
16 Insulating tube
17 Silicone shield, protective shield
18 Polyurethane sealing compound, elastomer
19 Holding pins
20 Insulating bar
21 Silicone body, elastomer
22 Fixings
23 Transformer oil, silicone oil, insulating liquid
24 Bellows, pressure compensation element
25 Flange at the high-voltage end
26 Flange at the ground end
27 Corona rings, potential control rings
28 Fiber plugs, fiber bushings
29 Equipotential lines
30 High-voltage outdoor switch
31 Conductor
32 High-voltage lattice pole
33 Suspension device
34 Grounding and anchoring cable
35 Fiber cable (for voltage and current sensor) at the ground end
36 Fiber stowage space
37 Fiber cable (for current sensor) at the high-voltage end
38 (Hybrid) optical current sensor
A Sensor axis
B Longitudinal axes of the sensor elements
C Longitudinal axes of the spacing elements
x Crystallographic x-axis of the quartz cylinders
L Total length of the voltage sensor
$L_i$ Length of the ith sensor element (i=1, . . . , n)
$d_j$ Length of the jth spacing element (j=1, . . . , n+1)
n Number of sensor elements

What is claimed as new and desired to be secured by letters patent of the United States is:

1. A fiber-optic voltage sensor suitable, in particular, for high-voltage measurement, having two connector contacts and a sensor axis, it being the case that
   a) the voltage sensor has at least one sensor element comprising a piezoelectric body and a sensor fiber fastened thereto, as well as several spacing elements, and
   b) the at least one sensor element and the spacing elements are arranged in an alternating fashion and one behind another along the sensor axis and are mechanically coupled, wherein
   c) the spacing elements are electrically conductive and make electric contact with the/each neighboring sensor element, and
   d) in order to form a high-voltage part of the voltage sensor which can be used outdoors, the arrangement of the sensor elements and spacing elements is surrounded by a high-voltage-proof dielectric and is provided with a protective shield.

2. The fiber-optic voltage sensor as claimed in claim 1, wherein
   a) the voltage sensor has at least two sensor elements with a continuous sensor fiber,
   b) in the/each sensor element the sensor fiber is fastened with a prescribable length section to the body such that it experiences changes in length only by virtue of E-field components parallel to the sensor axis and c) the/each sensor element has a gain which is proportional to its length and corresponds to the piezoelectrically induced change in length of the sensor fiber.

3. The fiber-optic voltage sensor as claimed in claim 2, wherein
   a) the sensor elements and spacing elements are of cylindrical configuration and are aligned with their axes along the sensor axis, and
   b) electrically conductive, flexible holders are provided between neighboring sensor elements and spacing elements.

4. The fiber-optic voltage sensor as claimed in claim 3, wherein
   a) the holders have inner electrodes, control electrodes and spring elements,
   b) the inner electrodes are connected in a self-closed and bonded fashion to the end faces of the sensor elements,
   c) the control electrodes are fastened to the inner electrodes, and
   d) the spring elements connect the inner electrodes to the neighboring spacing elements.

5. The fiber-optic voltage sensor as claimed in one of claim 1, wherein
   a) the dielectric consists of an elastomer or an insulating liquid and
   b) the protective shield consists of an elastomer and additionally comprises a post insulator.

6. The fiber-optic voltage sensor as claimed in claim 5, wherein
   a) the dielectric consists of a polyurethane sealing compound,
   b) the protective shield consists of a silicone sealing compound in the form of a ribbed silicone shield, and
   c) the silicone shield is seated on an insulating tube made from a fiber-reinforced plastic.

7. The fiber-optic voltage sensor as claimed in claim 5, wherein
   a) the dielectric and the protective shield consist of a silicone sealing compound in the form of a ribbed silicone body and
   b) the silicone body additionally has at least one insulating bar made from a fiber-reinforced plastic.

8. The fiber-optic voltage sensor as claimed in claim 5, wherein
   a) the dielectric is a transformer or silicone oil,
   b) the protective shield consists of a silicone sealing compound in the form of a ribbed silicone shield,
   c) the silicone shield is seated on an insulating tube made from a fiber-reinforced plastic, and
   d) a pressure compensation element for the oil and oil-tight fiber bushings are provided.

9. The fiber-optic voltage sensor as claimed in one of claim 5, wherein the high-voltage part has connector contacts in the form of flanges, a suspension device, at least one corona and/or potential control ring and a grounding and anchoring cable.

10. The fiber-optic voltage sensor as claimed in claim 9, wherein
    a) the flange at the ground end has fiber plugs, and the flange at the high-voltage end has a fiber stowage space,
    b) in addition, an isolated current sensor is provided, for which optical feed fibers are also sealed in the high-voltage part, and
    c) freely suspended fiber cables are provided between the current sensor and the flange at the high-voltage end, and between the flange at the ground end and a measurement apparatus.

11. The fiber-optic voltage sensor as claimed in claim 10, wherein
    a) a total length and a diameter of the high-voltage part, as well as a number, length, position and a diameter of the sensor elements are selected in accordance with a high-voltage class of the voltage sensor, and
    b) in particular, the length of the sensor elements is selected to be equal, and their spacings are selected to increase relative to ground potential.

12. The fiber-optic voltage sensor as claimed in claim 11, wherein
    a) all the piezoelectric bodies consist of quartz, and
    b) all the quartz bodies are aligned with their crystallographic x-axis along the sensor axis and are identically orientated.

13. The fiber-optic voltage sensor as claimed in claim 12, wherein
    a) each sensor element has precisely one cylindrical quartz body which is preferably unipartite, and
    b) each quartz cylinder and the sensor fiber fastened thereto bridge the entire length of the associated sensor element.

14. The fiber-optic voltage sensor as claimed in claim 13, wherein
    a) all the quartz cylinders have precisely one prescribable diameter,
    b) the sensor fiber is wound on the circumference of each quartz cylinder with a constant, prescribable lead, and
    c) the sensor fiber is a double-mode fiber which is interconnected via a monomode connecting fiber to a double-mode receiving fiber in the manner of a tandem interferometer.

* * * * *